US007746685B2

(12) United States Patent
Kawasumi et al.

(10) Patent No.: US 7,746,685 B2
(45) Date of Patent: Jun. 29, 2010

(54) SEMICONDUCTOR MEMORY DEVICE

(75) Inventors: Atsushi Kawasumi, Kawasaki (JP); Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 12/207,949

(22) Filed: Sep. 10, 2008

(65) Prior Publication Data

US 2009/0067222 A1 Mar. 12, 2009

(30) Foreign Application Priority Data

Sep. 10, 2007 (JP) ............................. 2007-234446

(51) Int. Cl.
 *G11C 11/00* (2006.01)
(52) U.S. Cl. .................. 365/154; 365/189.15; 257/351
(58) Field of Classification Search ................ 365/154, 365/189.15; 257/351
 See application file for complete search history.

(56) References Cited

U.S. PATENT DOCUMENTS 6,363,006 B2  3/2002 Naffziger et al.

7,400,524 B2 * 7/2008 Otsuka ........................ 365/154

FOREIGN PATENT DOCUMENTS

| JP | 2-151066   | 6/1990 |
| JP | 2001-28401 | 1/2001 |
| JP | 2003-86713 | 3/2003 |

OTHER PUBLICATIONS

U.S. Appl. No. 12/343,996, filed Dec. 24, 2008, Kawasumi.

* cited by examiner

*Primary Examiner*—Son Dinh
*Assistant Examiner*—Nam Nguyen
(74) *Attorney, Agent, or Firm*—Oblon, Spivak, McClelland, Maier & Neustadt, L.L.P.

(57) ABSTRACT

SRAM cells are arranged in matrix along a first and a second bit line and a word line for single-ended reading of data from the second bit line. A first NMOS transistor and a first transfer transistor contained in the SRAM cell are formed in a first well with respective identical gate lengths and gate widths. A second NMOS transistor and a second transfer transistor contained in the SRAM cell are formed in a second well with respective identical gate lengths and gate widths. These gate widths are made wider than the gate widths of the first NMOS transistor and the first transfer transistor.

20 Claims, 4 Drawing Sheets

(Read port)

SEMICONDUCTOR MEMORY DEVICE

CROSS-REFERENCE TO RELATED APPLICATION

This application is based upon and claims the benefit of priority from prior Japanese Patent Application No. 2007-234446, filed on Sep. 10, 2007, the entire contents of which are incorporated herein by reference.

BACKGROUND OF THE INVENTION

1. Field of the Invention

The present invention relates to a semiconductor memory device comprising a cell array of SRAM (Static Random Access Memory) cells arranged in matrix.

2. Description of the Related Art

In general, a SRAM cell comprises two PMOS transistors, two NMOS transistors and two transfer transistors: a total of six MOS transistors. The SRAM cell is laid out in an almost point symmetrical pattern in an N-well and P-wells at both sides thereof. More specifically, each transistor has a source and a drain extending in parallel with a boundary between well regions and a gate extending in the direction orthogonal to the above boundary (see, for example, JP 2001-28401A).

In recent years, reductions in device size with developed scaling cause random variations among transistors, which make it difficult to eliminate the tradeoff between the retained cell stability and the improved read/write characteristics with retained fine patterns.

The SRAM cell stability is estimated by the fact that data held in the SRAM cell is not inverted when a transfer transistor turns on while a pair of bit lines are both at "1". Desirably, the transfer transistor has trans-conductance $\beta(xf)$ ($\propto Wxf/Lxf$: where Wxf denotes a gate width; Lxf a gate length) smaller than $\beta(pd)$ of the NMOS transistor. Therefore, the transfer transistor and the NMOS transistor are usually formed in the same impurity-diffused region such that the former has a narrower gate width than the gate width of the latter (for example, JP 2001-28401A, FIG. 1).

On the other hand, an improvement in the read characteristic desires a larger cell current Icell flowing in the transfer transistor and the NMOS transistor. The cell current Icell is almost determined from the trans-conductance $\beta(xf)$ of the transfer transistor having a lower drive ability than the NMOS transistor. Accordingly, as large $\beta(xf)$ as possible is desirable.

The write characteristic can be improved if $\beta(xf)$ of the transfer transistor is larger than $\beta(pu)$ of the PMOS transistor. Therefore, there is a request for larger $\beta(xf)$ also from this viewpoint.

Fine patterning of devices increasingly makes it difficult to eliminate such the tradeoff required for the transfer transistor.

SUMMARY OF THE INVENTION

In an aspect the present invention provides a semiconductor memory device comprising SRAM cells arranged in matrix, each SRAM cell including: a first inverter containing a first PMOS transistor and a first NMOS transistor, a second inverter containing a second PMOS transistor and a second NMOS transistor, the first and second inverters having respective inputs and outputs cross-connected, a first transfer transistor connected between a first bit line and the output terminal of the first inverter, and a second transfer transistor connected between a second bit line and the output terminal of the second inverter, the first and second transfer transistors having respective gates connected to a word line, the second bit line used in single-ended reading of data therefrom, wherein the first NMOS transistor and the first transfer transistor are formed in a first well with respective identical gate lengths and gate widths, wherein the second NMOS transistor and the second transfer transistor are formed in a second well with respective identical gate lengths and gate widths, the gate widths made wider than the gate widths of the first NMOS transistor and the first transfer transistor.

In another aspect the present invention provides a semiconductor memory device comprising SRAM cells arranged in matrix, each SRAM cell including a first inverter containing a first PMOS transistor and a first NMOS transistor, a second inverter containing a second PMOS transistor and a second NMOS transistor, the first and second inverters having respective inputs and outputs cross-connected, a first transfer transistor connected between a first bit line and the output terminal of the first inverter, and a second transfer transistor connected between a second bit line and the output terminal of the second inverter, the first and second transfer transistors having respective gates connected to a word line, the second bit line used in single-ended reading of data therefrom, the device further comprising a first P-well, an N-well and a second P-well formed in this turn in the direction of extension of the word line, wherein the first NMOS transistor and the first transfer transistor are formed in the first P-well, wherein the second NMOS transistor and the second transfer transistor are formed in the second P-well, wherein the second NMOS transistor and the second transfer transistor have respective gate widths wider than the gate widths of the first NMOS transistor and the first transfer transistor.

In yet another aspect the present invention provides a semiconductor memory device comprising SRAM cells arranged in matrix, each SRAM cell including a first inverter containing a first PMOS transistor and a first NMOS transistor, a second inverter containing a second PMOS transistor and a second NMOS transistor, the first and second inverters having respective inputs and outputs cross-connected, a first transfer transistor connected between a first bit line and the output terminal of the first inverter, and a second transfer transistor connected between a second bit line and the output terminal of the second inverter, the first and second transfer transistors having respective gates connected to a word line, the second bit line used in single-ended reading of data therefrom, the device further comprising a first P-well, an N-well and a second P-well formed in this turn in the direction of extension of the word line, wherein the first NMOS transistor and the first transfer transistor are formed in the first P-well, wherein the second NMOS transistor and the second transfer transistor are formed in the second P-well, wherein the first NMOS transistor has a gate length of Lpd1 and a gate width of Wpd1, the first transfer transistor has a gate length of Lxf1 and a gate width of Wxf1, the second NMOS transistor has a gate length of Lpd2 and a gate width of Wpd2, and the second transfer transistor has a gate length of Lxf2 and a gate width of Wxf2, wherein Wxf1<Wxf2 and Wpd1<Wpd2, wherein Lpd1/Lxf1, Wxf1/Wpd1, Lpd2/Lxf2 and Wxf2/Wpd2 are set within a range of 1.00±0.05.

DETAILED DESCRIPTION OF THE EMBODIMENTS

The embodiments of the invention will now be described with reference to the drawings.

First Embodiment

Figure 1:
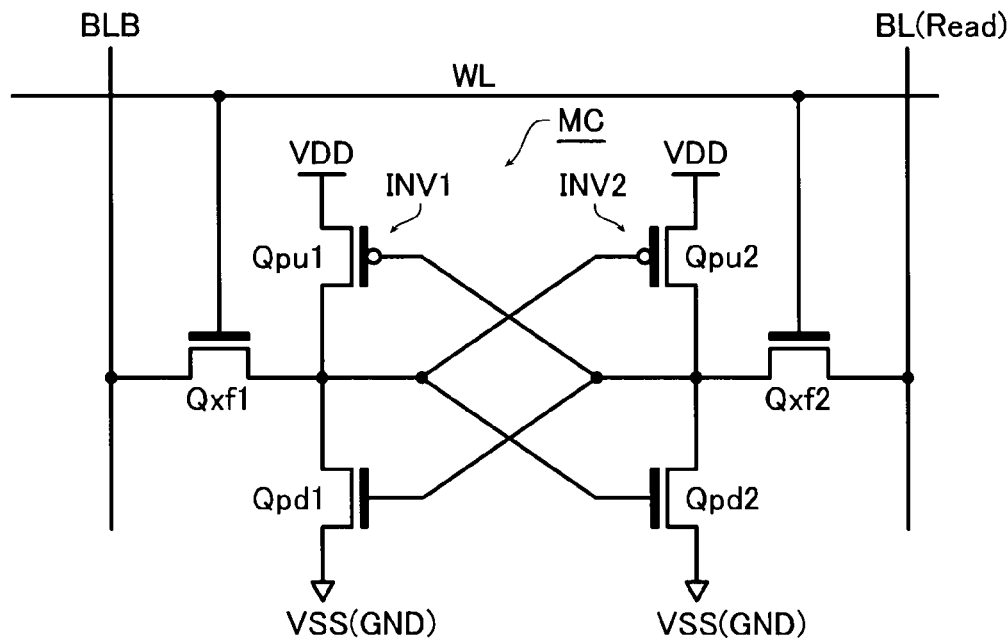
FIG. 1 is a circuit diagram of a SRAM cell according to a first embodiment of the present invention.

FIG. 1 is a circuit diagram of a SRAM cell MC contained in a semiconductor memory device according to a first embodiment of the present invention.

The SRAM cell MC includes a first inverter INV1 containing a first PMOS transistor Qpu1 and a first NMOS transistor Qpd1 connected in a complementary pair and having respective sources connected to the power line VDD and the ground line VSS. It also includes a second inverter INV2 containing a second PMOS transistor Qpu2 and a second NMOS transistor Qpd2 connected in a complementary pair and having respective sources connected to the power line VDD and the ground line VSS. The first and second inverters have respective inputs and outputs cross-connected. A first transfer transistor Qxf1 is connected between a first bit line BLB and the output terminal of the first inverter INV1. A second transfer transistor Qxf2 is connected between a second bit line BL (Read) and the output terminal of the second inverter INV2. The first and second transfer transistors Qxf1, Qxf2 have respective gates connected to a word line WL. In this SRAM cell array, writing is executed with both bit lines BL, BLB while reading is executed only with one bit line BL as single-ended reading.

Figure 2:
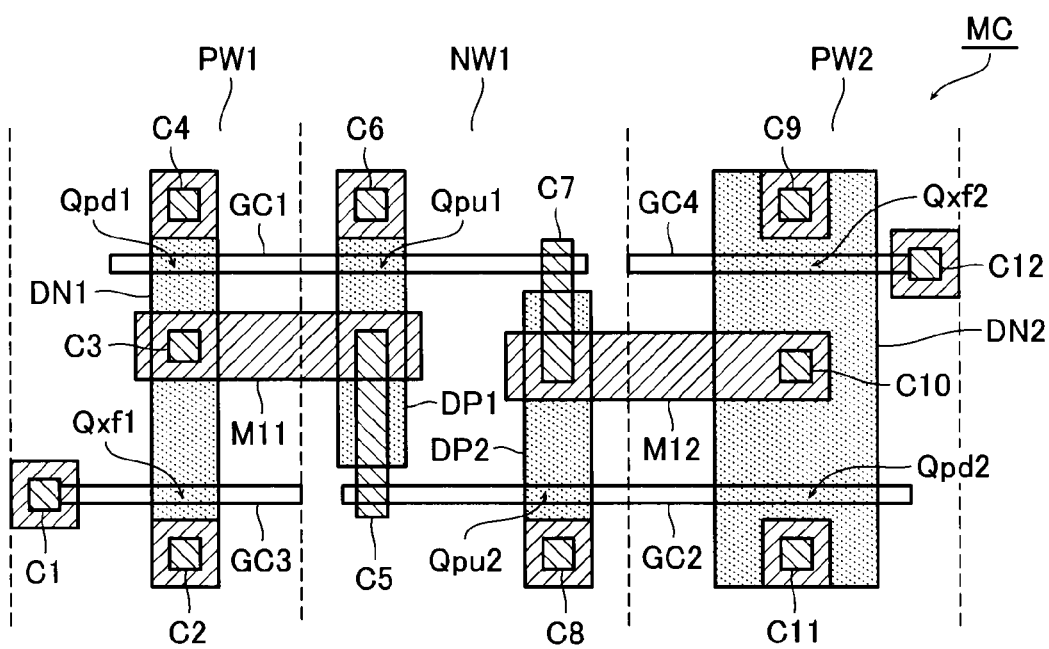
FIG. 2 is a plan view showing a layout of the SRAM cell on a semiconductor substrate according to the same embodiment.

FIG. 2 is a plan view showing a layout of the SRAM cell MC on a semiconductor substrate according to the present embodiment. This layout depicts layouts overlapped in layers from well regions PW1, PW2 and NW1 to a first metal wiring layer. A second and a third upper metal wiring layer include the word line WL formed across the well regions PW1, PW2, NW1, and the bit lines BL and BLB formed in parallel along the well regions PW1, PW2, NW1. The power line VDD and the ground line VSS are arranged in parallel with the word line WL if the wiring layer including these lines formed therein is same as the word line WL, and in parallel with the bit lines BL, BLB if it is same as the bit lines BL, BLB.

One SRAM memory cell is formed in an almost point symmetrical pattern in three parallel well regions PW1, NW1, PW2 including an N-well region NW1 and P-well regions PW1, PW2 at both sides thereof. The N-well region NW1 contains P-type diffused layers DP1, DP2 formed in the shape of stripes extending in parallel with the N-well region NW1. The P-well regions PW1, PW2 contain N-type diffused layers DN1, DN2 formed in the shape of stripes extending in parallel with the P-well regions PW1, PW2, respectively. The N-type diffused layer DN2 has a width formed wider than the width of the N-type diffused layer DN1.

Along the P-type diffused layers DP1, DP2 in the N-well region NW1, the first PMOS transistor Qpu1 and the second PMOS transistor Qpu2 are formed, respectively. Along the N-type diffused layer DN1 in the P-well region PW1, the first NMOS transistor Qpd1 and the first transfer transistor Qxf1 are formed in series. Along the N-type diffused layer DN2 in the P-well region PW2, the second NMOS transistor Qpd2 and the second transfer transistor Qxf2 are formed in series. The transistors Qpu1, Qpd1 have a common gate GC1, which is formed of polysilicon in a stripe extending across a boundary between the well regions NW1, PW1. The transistors Qpu2, Qpd2 have a common gate GC2, which is formed of polysilicon in a stripe extending across a boundary between the well regions NW1, PW2. The transistors Qpu1, Qpd1 have respective drains, which are connected to each other via a metal wiring layer M11 extending across a boundary between the well regions NW1, PW1 and to the common gate GC2 of the transistors Qpu2, Qpd2 via a contact C5. The transistors Qpu2, Qpd2 have respective drains, which are connected to each other via a metal wiring layer M12 extending across a boundary between the well regions NW1, PW2 and to the common gate GC1 of the transistors Qpu1, Qpd1 via a contact C7. The transistors Qpu1, Qpu2 have respective sources, which are connected to the power line VDD in the upper layer via contacts C6, C8, respectively. The transistors Qpd1, Qpd2 have respective sources, which are connected to the ground line VSS via contacts C4, C11, respectively. The transfer transistors Qxf1, Qxf2 have respective gates GC3, GC4, which are formed of polysilicon in stripes extending across the well regions NW1, PW2, respectively, and connected via contacts C1, C12 to the word line WL formed in the upper layer across the well regions, respectively. The transfer transistors Qxf1, Qxf2 have respective sources, which are connected via contacts C2, C9 to the bit lines BL, BLB formed in the upper layer, respectively.

Figure 3:
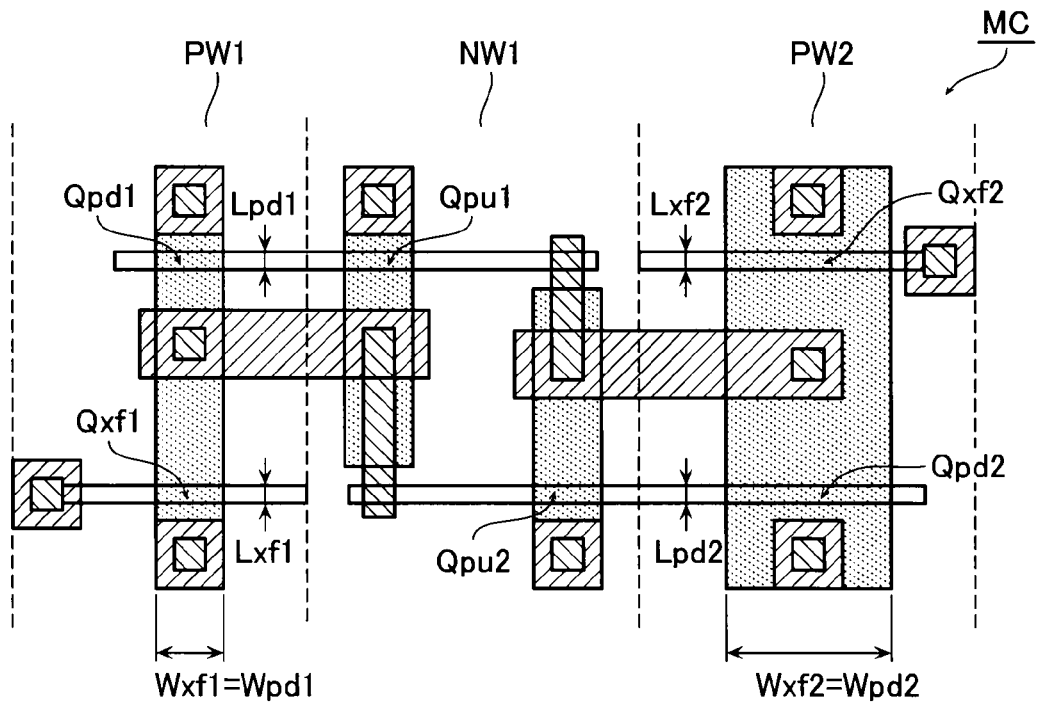
FIG. 3 is a plan view illustrative of gate widths and gate lengths of transistors in the same embodiment.

Referring next to FIG. 3, the following description is given to gate lengths and gate widths of the NMOS transistor Qpd1 and the transfer transistor Qxf1 formed in the P-well region PW1 and of the NMOS transistor Qpd2 and the transfer transistor Qxf2 formed in the P-well region PW2. In FIG. 3, the NMOS transistor Qpd1 has a gate width of Wpd1 and a gate length of Lpd1, the transfer transistor Qxf1 has a gate width of Wxf1 and a gate length of Lxf1, the NMOS transistor Qpd2 has a gate width of Wpd2 and a gate length of Lpd2, and the transfer transistor Qxf2 has a gate width of Wxf2 and a gate length of Lxf2. These are set as follows.

$$Wxf1 = Wpd1 < Wxf2 = Wpd2$$

$$Lxf1 = Lpd1, Lxf2 = Lpd2 \qquad \text{[Expression 1]}$$

Therefore, as obvious from the above Expression 1, in the SRAM cell according to the present embodiment, the transfer transistor Qxf2 has a larger drive force and allows a larger amount of cell current Icell to flow than the transfer transistor Qxf1. In this embodiment, single-ended reading is executed by reading from the bit line BL connected to the transfer transistor Qxf2, thereby enabling fast reading.

The trans-conductance ratios $\beta1$, $\beta2$ of the NMOS transistors Qpd1, Qpd2 to the transfer transistors Qxf1, Qxf2 are derived as follows.

$$\beta1 = (Lxf1 * Wpd1)/(Lpd1 * Wxf1) = 1$$

$$\beta2 = (Lxf2 * Wpd2)/(Lpd2 * Wxf2) = 1 \qquad \text{[Expression 2]}$$

If $\beta1$, $\beta2 = 1$ as above, $\beta1$, $\beta2$ will not vary as follows even when process fluctuation elements $\Delta W$, $\Delta L$ arise.

$$\beta1 = \{(Lxf1 - \Delta L) * (Wpd1 - \Delta W)\} / \{(Lpd1 - \Delta L) * (Wxf1 - \Delta W)\} = 1$$

$$\beta2 = \{(Lxf2 - \Delta L) * (Wpd2 - \Delta W)\} / \{(Lpd2 - \Delta L) * (Wxf2 - \Delta W)\} = 1 \qquad \text{[Expression 3]}$$

Therefore, even if the left and right N-channel MOS transistors are formed asymmetrical as in the present embodiment, almost no influence is exerted on the process fluctuation elements ΔW, ΔL.

This embodiment defines relations of Wpd=Wxf and Lpd=Lxf though they may be defined as Wpd≠Wxf and Lpd≠Lxf without impairing the effect of the present invention. In this case, the fluctuating amount Δβ of the transconductance ratio β due to the process fluctuation elements ΔW, ΔL can be represented as follows.

$$\Delta\beta = (1/Lxf - 1/Lpd)\Delta L + (1/Wpd - 1/Wxf)\Delta W \quad \text{[Expression 4]}$$

In general, as the fluctuating amount relative to the minimum values of the channel width W and the channel length L can be regarded as 10%, then $$\Delta\beta/\beta = 0.1(Lpd/Lxf - 1) + 0.1(Wxf/Wpd - 1) \quad \text{[Expression 5]}$$

Desirably, the fluctuating amount of Δβ/β is 1% or below. Accordingly, in this case, Lpd/Lxf and Wxf/Wpd may be set within a range of 1±0.05, respectively. Therefore, if 0.95≦Lpd/Lxf and Wxf/Wpd≦1.05, then the influence to the process fluctuations can be suppressed lower than 1%.

In the above embodiment, setting β almost near 1 lowers the SRAM cell stability than when β is larger than 1, that is, the driver NMOS transistor has a broader channel width than the channel width of the transfer transistor. The SRAM cell stability may be satisfied by dividing the SRAM cell array into parts along the bit line BL, BLB and restricting the number of SRAM cells connected to the bit lines BL, BLB to several tens.

Figure 4:
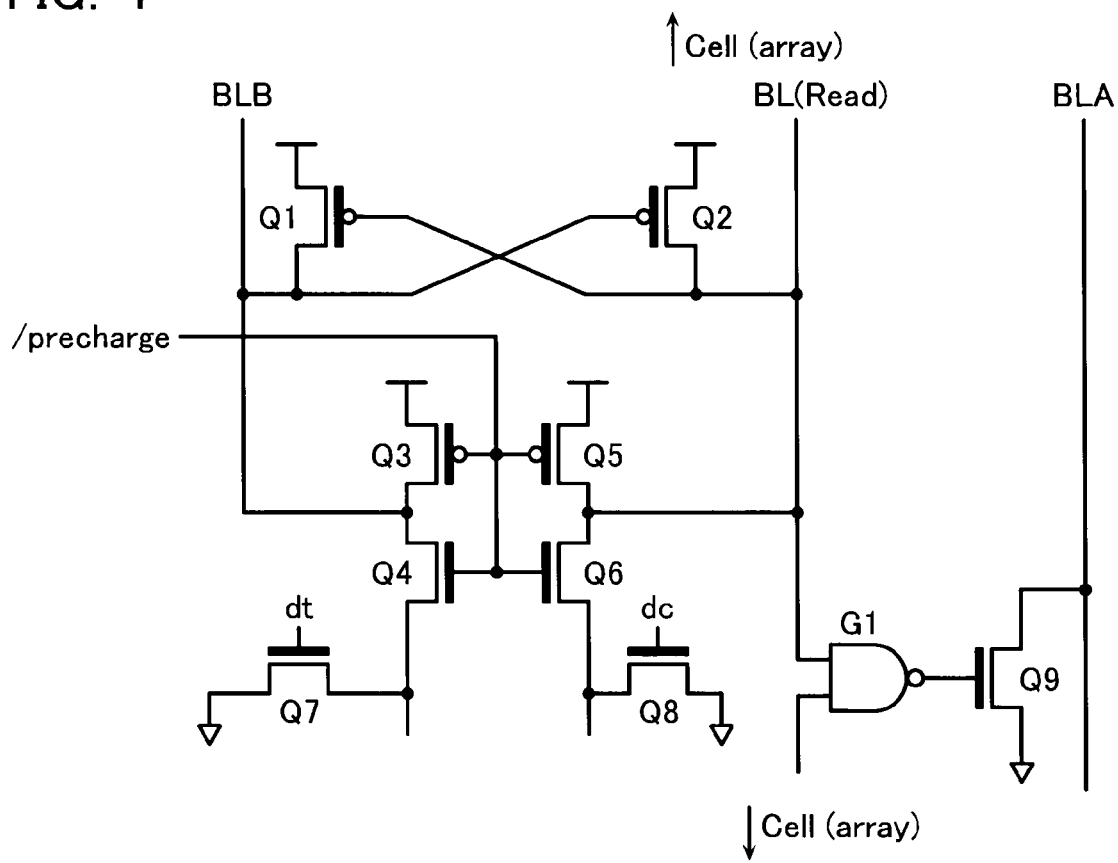
FIG. 4 is a circuit diagram of a single-ended reading circuit in the same embodiment.

FIG. 4 is a circuit diagram of a single-ended reading circuit in the sense amp circuit suitable for the SRAM cell array divided to use.

Driver transistors Q1, Q2 operative to amplify the potential difference between the bit lines BLB, BL are connected between the bit lines BL, BLB in such a manner that respective gate terminals and drain terminals are cross-connected. Also connected between the bit lines BL, BLB are transistors Q3-Q8 for precharging and resetting the bit lines BL, BLB with a precharge signal, /precharge. The bit line BL for read use is divided into an upper and a lower part and data on any one part is read out through a gate G1 to an upper hierarchical bit line BLA via a transistor Q9.

The use of such the reading circuit can increase the number of divided parts in the bit line BL and reduce the number of cells connected to the bit line BL, thereby lowering the bit line capacity and improving the read speed while retaining the cell stability.

Second Embodiment

Figure 5:
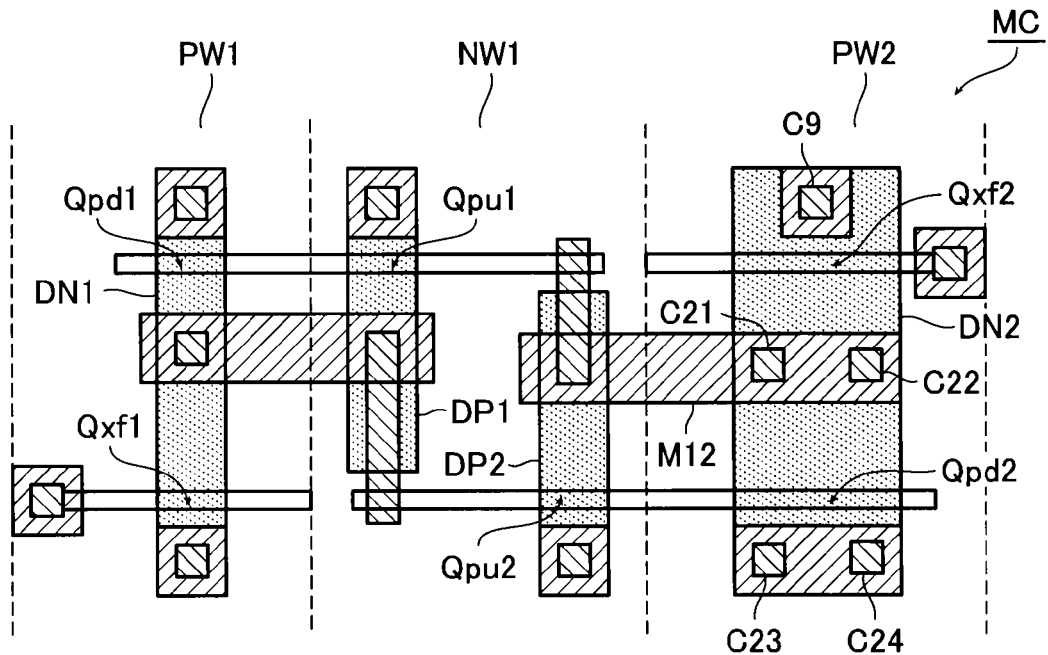
FIG. 5 is a plan view showing a layout of a SRAM cell on a semiconductor substrate according to a second embodiment of the present invention.

FIG. 5 is a plan view showing a layout of a SRAM cell MC on a semiconductor substrate according to a second embodiment of the present invention. This embodiment differs from the preceding first embodiment in the number of contacts in the impurity-diffused layer DN2 including the driver NMOS transistor Qpd2 and the transfer transistor Qxf2 formed therein, which have a wider channel width on the read side. Namely, the width of the impurity-diffused layer DN2 for the transistors on the read side is wider than the width of the impurity-diffused layer DN1 on the non-read side. Therefore, for improvements in the reliability of contacts, the number of contacts in the wider impurity-diffused layer DN2 is usually increased as many as possible. In this embodiment, two contacts C21, C22 are provided to connect the common drain of the NMOS transistor Qpd2 and the transfer transistor Qxf2 with the metal wiring layer M12. In addition, two contacts C23, C24 are provided to connect the source of the NMOS transistor Qpd2 with the ground. This embodiment is though characterized in that the contact C9 for connecting the source of the transfer transistor Qxf2 with the bit line BL is only one. In spite of the fact that the number of contacts between the transfer transistor and the bit line can be increased originally, it is made smaller than the number of other contacts. This makes it possible to reduce the contact-gate capacity, reduce the bit line capacity, and improve the cell retention and stability.

Third Embodiment

Figure 6:
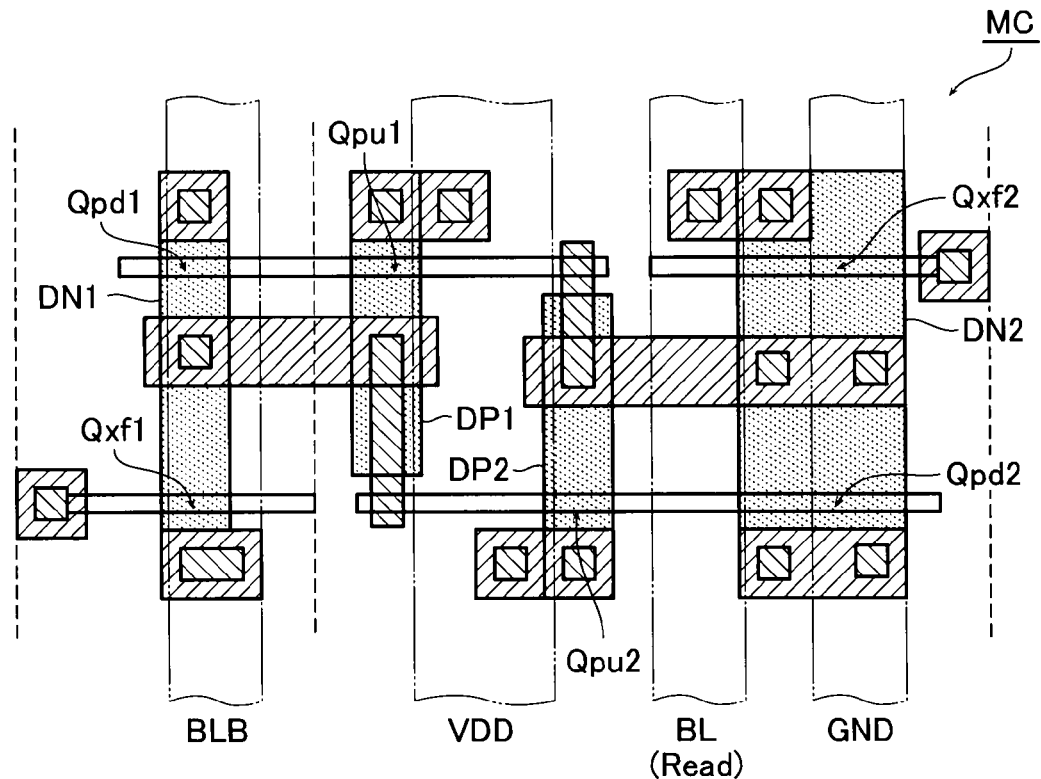
FIG. 6 is a plan view showing a layout of a SRAM cell on a semiconductor substrate according to a third embodiment of the present invention.

FIG. 6 is a plan view showing a layout of a SRAM cell MC on a semiconductor substrate according to a third embodiment of the present invention. This embodiment relates to a layout of the ground line GND. In general, if the ground line GND is wired in the same metal wiring layer as the word line WL, it is wired in parallel with the word line WL. In this case, however, cell currents from a number of SRAM cells linked to the word line WL flow into the ground line and accordingly the IR drop exerts a larger influence. In contrast, if the ground line GND is wired in the same metal wiring layer as the bit lines BL, BLB, it is wired in parallel with the bit lines BL, BLB. Accordingly, cell current flowing in each ground line GND includes only current flowing in the cell selected by the word line WL and accordingly the IR drop exerts a less influence.

In the present embodiment, the impurity-diffused layer DN2 including the NMOS transistor Qpd2 and the transfer transistor Qxf2 on the read side formed therein has a broader width. Accordingly, the ground line GND is only arranged in parallel with the bit lines BL, BLB and the power line VDD and close to the bit line BL on the read side. As the ground line GND is not arranged on the non-read side, the source of the NMOS transistor Qpd1 on the non-read side is connected to the ground line GND via a metal wiring layer different from the metal wiring layer including the bit lines BL, BLB and the power line VDD formed therein. Thus, the SRAM cell MC includes only four lines: the bit line BLB, the power line VDD, the bit line BL and the ground line GND wired in this turn. Accordingly, it is possible to provide a margin in the wiring space, keep a large space between lines, and reduce the bit line capacity.

Fourth Embodiment

Figure 7:
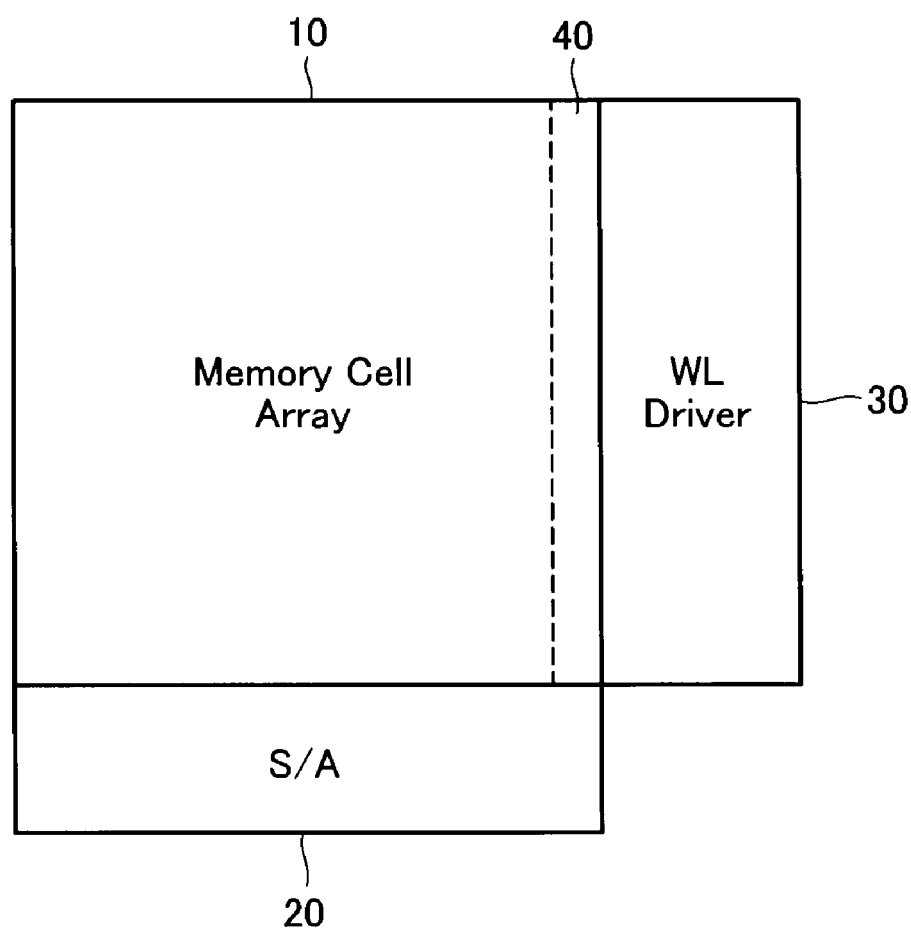
FIG. 7 is a plan view of the major part of a SRAM according to a fourth embodiment of the present invention.

FIG. 7 is a brief plan view of the major part of a SRAM according to a fourth embodiment of the present invention. The above-described SRAM cells MC are arranged in matrix along the bit lines BL, BLB and the word line WL in a memory cell array 10, to which a sense amp circuit 20 adjoins in the bit line direction and a word line driver 30 in the word line direction. In general, the memory cell array 10 has ends, which easily suffer the influences from peeled off resists and process variations. Therefore, memory cells formed at the ends of the memory cell array 10 have lower reliability and these memory cells are usually used as dummy cells that can not contribute to normal operation.

In this embodiment, the width of the impurity-diffused layer for the transistors on the read side is wider than that for other transistors. Accordingly, an arrangement of the impurity-diffused layer adjacent to the word line driver 30 can reduce the influence from process variations and eliminate the arrangement of dummy cells at the end 40 close to the word line driver 30. Therefore, normal SRAM cells MC can be arranged also at the end 40 to reduce the useless space.

If the transistors on the read side are arranged on the opposite side, dummy cells at the end on the opposite side of the memory cell array 10 can be omitted, needless to say.

What is claimed is:

1. A semiconductor memory device comprising SRAM cells arranged in matrix, each SRAM cell including;
   a first inverter containing a first PMOS transistor and a first NMOS transistor,
   a second inverter containing a second PMOS transistor and a second NMOS transistor, said first and second inverters having respective inputs and outputs cross-connected,
   a first transfer transistor connected between a first bit line and the output terminal of said first inverter, and
   a second transfer transistor connected between a second bit line and the output terminal of said second inverter, said first and second transfer transistors having respective gates connected to a word line, said second bit line used in single-ended reading of data therefrom,
   wherein said first NMOS transistor and said first transfer transistor are formed in a first well with respective identical gate lengths and gate widths,
   wherein said second NMOS transistor and said second transfer transistor are formed in a second well with respective identical gate lengths and gate widths, said gate widths made wider than said gate widths of said first NMOS transistor and said first transfer transistor.

2. The semiconductor memory device according to claim 1, further comprising an impurity-diffused region formed in said second well to form said second NMOS transistor and said second transfer transistor therein, wherein the number of contacts with said second bit line in said impurity-diffused region is less than the number of contacts with other portions present in said impurity-diffused region.

3. The semiconductor memory device according to claim 1, further comprising a ground line for supplying the ground potential to the source of said second NMOS transistor, said ground line formed on said second well in parallel with said second bit line and not formed on said first well.

4. The semiconductor memory device according to claim 1, further comprising a word line driver arranged adjacent to a SRAM cell array region containing said SRAM cells arranged in matrix,
   wherein said SRAM cell array has an end close to said word line driver, at which said second NMOS transistor and said second transfer transistor are arranged adjacent to said word line driver.

5. The semiconductor memory device according to claim 1, wherein said first NMOS transistor has a gate length of Lpd1 and a gate width of Wpd1, said first transfer transistor has a gate length of Lxf1 and a gate width of Wxf1, said second NMOS transistor has a gate length of Lpd2 and a gate width of Wpd2, and said second transfer transistor has a gate length of Lxf2 and a gate width of Wxf2,
   wherein Lpd1/Lxf1, Wxf1/Wpd1, Lpd2/Lxf2 and Wxf2/Wpd2 are set within a range of 1.00±0.05.

6. The semiconductor memory device according to claim 1, wherein said first bit line and said second bit line are both used in writing data in said SRAM cell.

7. The semiconductor memory device according to claim 1, wherein said word line is formed on said first well and said second well across said first well and said second well.

8. The semiconductor memory device according to claim 1, wherein said first bit line and said second bit line are formed on said first well and said second well in parallel along said first well and said second well.

9. The semiconductor memory device according to claim 1, wherein said first PMOS transistor and said first NMOS transistor or said second PMOS transistor and said second NMOS transistor have respective sources connected to a power line or ground line for supplying the supply potential or ground potential, which are formed on said first well and said second well across said first well and said second well and in parallel with said word line.

10. The semiconductor memory device according to claim 1, wherein said first PMOS transistor and said first NMOS transistor or said second PMOS transistor and said second NMOS transistor have respective sources connected to a power line or ground line for supplying the supply potential or ground potential, which are formed on said first well and said second well along said first well and said second well and in parallel with said first bit line and said second bit line.

11. The semiconductor memory device according to claim 1, further comprising a third well arranged to form said first PMOS transistor and said second PMOS transistor therein, wherein said SRAM cell is laid out in an almost point symmetrical pattern in said third well and said first and second wells at both sides thereof.

12. The semiconductor memory device according to claim 1, wherein said first NMOS transistor and said first transfer transistor are serially formed in a first, stripe-shaped, N-type diffused layer formed in a first well region and extending in parallel with said first well region,
   wherein said second NMOS transistor and said second transfer transistor are serially formed in a second, stripe-shaped, N-type diffused layer formed in a second well region and extending in parallel with said second well region,
   wherein said second N-type diffused layer has a width formed wider than the width of said first N-type diffused layer, whereby said second NMOS transistor and said second transfer transistor have respective widths formed wider than the widths of said first NMOS transistor and said first transfer transistor.

13. The semiconductor memory device according to claim 1, wherein said second bit line is divided into parts in a SRAM cell array region containing said SRAM cells arranged in matrix, further comprising a single-ended reading circuit operative to read data out of any one of said divided parts of said second bit line.

14. A semiconductor memory device comprising SRAM cells arranged in matrix, each SRAM cell including
   a first inverter containing a first PMOS transistor and a first NMOS transistor,
   a second inverter containing a second PMOS transistor and a second NMOS transistor, said first and second inverters having respective inputs and outputs cross-connected,
   a first transfer transistor connected between a first bit line and the output terminal of said first inverter, and
   a second transfer transistor connected between a second bit line and the output terminal of said second inverter, said first and second transfer transistors having respective gates connected to a word line, said second bit line used in single-ended reading of data therefrom, the device further comprising
   a first P-well, an N-well and a second P-well formed in this turn in the direction of extension of said word line,
   wherein said first NMOS transistor and said first transfer transistor are formed in said first P-well,
   wherein said second NMOS transistor and said second transfer transistor are formed in said second P-well, wherein said second NMOS transistor and said second transfer transistor have respective gate widths wider than the gate widths of said first NMOS transistor and said first transfer transistor.

15. The semiconductor memory device according to claim 14, further comprising an impurity-diffused region formed in said second P-well to form said second NMOS transistor and said second transfer transistor therein, wherein the number of contacts with said second bit line in said impurity-diffused region is less than the number of contacts with other portions present in said impurity-diffused region.

16. The semiconductor memory device according to claim 14, further comprising a ground line for supplying the ground potential to the source of said second NMOS transistor, said ground line formed on said second well in parallel with said second bit line and not formed on said first well.

17. The semiconductor memory device according to claim 14, further comprising a word line driver arranged adjacent to a SRAM cell array region containing said SRAM cells arranged in matrix,
wherein said SRAM cell array has an end close to said word line driver, at which said second NMOS transistor and said second transfer transistor are arranged adjacent to said word line driver.

18. The semiconductor memory device according to claim 14, wherein said first NMOS transistor has a gate length of Lpd1 and a gate width of Wpd1, said first transfer transistor has a gate length of Lxf1 and a gate width of Wxf1, said second NMOS transistor has a gate length of Lpd2 and a gate width of Wpd2, and said second transfer transistor has a gate length of Lxf2 and a gate width of Wxf2,
wherein Lpd1/Lxf1, Wxf1/Wpd1, Lpd2/Lxf2 and Wxf2/Wpd2 are set within a range of 1.00±0.05.

19. A semiconductor memory device comprising SRAM cells arranged in matrix, each SRAM cell including
a first inverter containing a first PMOS transistor and a first NMOS transistor,
a second inverter containing a second PMOS transistor and a second NMOS transistor, said first and second inverters having respective inputs and outputs cross-connected,
a first transfer transistor connected between a first bit line and the output terminal of said first inverter, and
a second transfer transistor connected between a second bit line and the output terminal of said second inverter, said first and second transfer transistors having respective gates connected to a word line, said second bit line used in single-ended reading of data therefrom, the device further comprising
a first P-well, an N-well and a second P-well formed in this turn in the direction of extension of said word line,
wherein said first NMOS transistor and said first transfer transistor are formed in said first P-well,
wherein said second NMOS transistor and said second transfer transistor are formed in said second P-well,
wherein said first NMOS transistor has a gate length of Lpd1 and a gate width of Wpd1, said first transfer transistor has a gate length of Lxf1 and a gate width of Wxf1, said second NMOS transistor has a gate length of Lpd2 and a gate width of Wpd2, and said second transfer transistor has a gate length of Lxf2 and a gate width of Wxf2,
wherein Wxf1<Wxf2 and Wpd1<Wpd2,
wherein Lpd1/Lxf1, Wxf1/Wpd1, Lpd2/Lxf2 and Wxf2/Wpd2 are set within a range of 1.00±0.05.

20. The semiconductor memory device according to claim 19, further comprising a word line driver arranged adjacent to a SRAM cell array region containing said SRAM cells arranged in matrix,
wherein said SRAM cell array has an end close to said word line driver, at which said second NMOS transistor and said second transfer transistor are arranged adjacent to said word line driver.

* * * * *